United States Patent
Bradl et al.

(10) Patent No.: US 7,566,378 B2
(45) Date of Patent: Jul. 28, 2009

(54) ARRANGEMENT OF ELECTRONIC SEMICONDUCTOR COMPONENTS ON A CARRIER SYSTEM FOR TREATING SAID SEMICONDUCTOR COMPONENTS WITH A LIQUID MEDIUM

(75) Inventors: Stephan Bradl, Regensburg (DE); Michael Melzl, Neutraubling (DE); Josef Schwaiger, Teugn (DE); Thilo Stache, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/438,906

(22) Filed: May 23, 2006

(65) Prior Publication Data
US 2006/0276010 A1 Dec. 7, 2006

Related U.S. Application Data

(63) Continuation of application No. PCT/DE2004/002164, filed on Sep. 29, 2004.

(30) Foreign Application Priority Data
Nov. 26, 2003 (DE) ................. 203 18 462

(51) Int. Cl.
H01L 21/00 (2006.01)
C23C 14/00 (2006.01)
C23C 16/00 (2006.01)
(52) U.S. Cl. .................... 156/345.23; 156/345.11; 156/345.51
(58) Field of Classification Search .......... 118/715–33; 156/345.11, 345.23, 345.51; 438/464
See application file for complete search history.

(56) References Cited

U.S. PATENT DOCUMENTS

| 4,903,717 A * | 2/1990 | Sumnitsch ................ 134/99.1 |
| 5,384,008 A | 1/1995 | Sinha et al. |
| 5,513,668 A | 5/1996 | Sumnitsch |
| 5,762,751 A | 6/1998 | Bleck et al. |
| 5,896,877 A * | 4/1999 | Pirker ........................ 134/153 |
| 6,672,318 B1 | 1/2004 | Tsuchiya et al. |
| 2002/0034860 A1 | 3/2002 | Miyamoto et al. |
| 2002/0048907 A1 | 4/2002 | Miyamoto et al. |
| 2002/0050244 A1 | 5/2002 | Engesser |

(Continued)

FOREIGN PATENT DOCUMENTS

DE 102 07 558 B4 9/2003

(Continued)

*Primary Examiner*—Ram N. Kackar
(74) *Attorney, Agent, or Firm*—Slater & Matsil, L.L.P.

(57) ABSTRACT

The invention relates to an arrangement of electronic semiconductor components on a carrier system for treating the semiconductor components with a liquid medium. A semiconductor component is detachably mounted on the carrier system with the active side thereof in such a way that the arrangement comprises a gap at least in the edge region and partially between the semiconductor components and the carrier system. The aim of the invention is to provide a detachable arrangement of electronic semiconductor components on a mechanically stable carrier system for safely handling the semiconductor components during the production process, wherein the capillarity of the gap between the semiconductor components and the carrier system is reduced in a controlled manner, thus preventing the damaging effect of a liquid medium seeping into the gap. To this end, the surface of the carrier system is shaped in such a way that the gap is widened along the entire edge region thereof.

20 Claims, 1 Drawing Sheet

U.S. PATENT DOCUMENTS

| | | |
|---|---|---|
| 2003/0198910 A1 | 10/2003 | Goodman |
| 2004/0103931 A1 | 6/2004 | Tsuchiya et al. |
| 2005/0026448 A1 | 2/2005 | Engesser |

FOREIGN PATENT DOCUMENTS

| | | | |
|---|---|---|---|
| EP | 0 866 494 A1 | | 9/1998 |
| EP | 1 083 589 A2 | | 3/2001 |
| EP | 1 202 326 A1 | | 5/2002 |
| JP | 2001075266 A | * | 3/2001 |
| JP | 2001-156039 | | 6/2001 |

* cited by examiner

ARRANGEMENT OF ELECTRONIC SEMICONDUCTOR COMPONENTS ON A CARRIER SYSTEM FOR TREATING SAID SEMICONDUCTOR COMPONENTS WITH A LIQUID MEDIUM

This application is a continuation of co-pending International Application No. PCT/DE2004/002164, filed Sep. 29, 2004, which designated the United States and was not published in English, and which is based on German Application No. 203 18 462.9, filed Nov. 26, 2003, both of which applications are incorporated herein by reference.

TECHNICAL FIELD

The invention relates to an arrangement of electronic semiconductor components on a carrier system for treating the semiconductor components with a liquid medium.

BACKGROUND

The arrangement of an electronic semiconductor component with the active side downward (face down) on a carrier system, so that there is at least in certain portions an edge between the semiconductor component and the carrier system in a way corresponding to the topography of the semiconductor component, is very frequently encountered in semiconductor technology. A gap may be required for technical process-related reasons and the medium flowing around the gap is chosen such that the gap is optimally filled under the influence of its capillary action, such as, for example, for the underfilling of the electronic semiconductor component in flip-chip technology.

Alternatively, the capillary action of the gap may lead to undesired flowing of the liquid medium under the semiconductor component. In any event, it is known that the capillary action depends on the width of the gap and the surface tension of the liquid medium as its material-typical property.

The flowing of a medium, in particular an etching medium, under the semiconductor component is to be prevented, since in the case of face-down mounting of the semiconductor component it can lead to undefined etching of its active side and, as a result, damage or even destruction of the electronic component.

This aspect is becoming increasingly significant in thin-wafer technology, since ever larger wafers are being produced at ever lower cost and in an ever thinner form, and ever greater requirements have to be met with respect to safe handling of the thin wafers as products. This requires the development of carrier technologies that allow safe handling of the thin wafers during production.

The handling of the electronic semiconductor components, in this case in the wafer array, on a carrier system leads to the active side of the electronic semiconductor components being influenced in the way described, in particular during wafer thinning by grinding in the presence of an abrasive liquid medium and by wet-chemical back etching of the wafer, the components being located within the gap in the face-down arrangement of the wafers on the carrier system and likewise exposed to the aggressive media as a result of the capillary action of the gap.

In the past, the damage to the semiconductor components has been minimized by frequent changing of the carrier system or by the thin wafers being handled for a short time, which however leads to a special effort being required and to increased costs, also on account of the susceptibility of the thin wafers to fracture.

A further possibility for protecting the active side of wafers from the aggressive media is at present to attach an adhesive film to this side. However, the film material drastically limits the temperature range that is available for the further process, generally to below 100° C. A further major disadvantage of this method is that the requirement to remove the film again requires the thin wafer to be of a certain thickness, which must be great enough to withstand the mechanical forces during the detachment of the film. This condition currently restricts the thickness of the thin wafers to about 100 μm. However, future technologies require far smaller wafer and component thicknesses.

SUMMARY OF THE INVENTION

The invention is consequently based on the object of providing a detachable arrangement of electronic semiconductor components on a mechanically stable carrier system for safely handling the semiconductor components as products in the production process, in which the capillary action of the gap between the semiconductor components and the carrier system is reduced in a controlled manner and consequently the damaging influence of a liquid medium seeping into the gap is prevented.

The object is achieved according to the invention by the surface of the carrier system having a profiling, which widens the gap in its entire edge region. As known, the depth of penetration into a gap acting as a capillary depends not only on the wetting properties of the materials that are present in the gap, that is to say the electronic semiconductor components and the carrier system, but also both on the properties of the liquid medium that is present, in particular the surface tension, and on the width of the gap. While the depth of penetration behaves in proportion to the surface tension of the medium, there is an inversely proportional relationship between the depth of penetration and the gap width.

Since it is only possible in individual cases for the materials of the electronic semiconductor components and the carrier system to be influenced in such a way that the depth of penetration of the medium into the gap is reduced and also the liquid medium is dependent on the process parameters, the relationship between the depth of penetration and the gap width is exploited and the penetration of the flowable medium that is present at the gap is prevented, or at least controlled, by the locally limited widening according to the invention of the gap between the electronic semiconductor component and the carrier system in its edge region.

This arrangement consequently makes it possible to use a carrier medium that is mechanically and thermally stable and does not have to adapt itself to the topography of the semiconductor components in order to avoid or at least minimize a gap. Carrier systems of this type ensure both safe handling in the production process on account of their own stability, required for this, and the mechanical attachment on the carrier system and the subsequent detachment of the semiconductor components. The mechanical attachment may be performed for example by methods that are known and suitable, such as spot adhesion or spot laser welding.

The form of the widening of the gap depends substantially on the topography of the active side of the semiconductor components that is facing the gap. If, for example, it is planar or at least virtually planar, the widening is performed exclusively by the profiling of the carrier system. If, on the other hand, there is a tapering on the gap side in the edge region of the semiconductor components, this may already be considered as partial gap widening and be included in the desired form of the edge of the gap.

Depressions in the surface of the electronic semiconductor components that is facing the gap, extending from the edge of the gap into the gap, are also to be taken into account when forming the widening of the gap near the edge. In the case of highly structured surfaces, it may well be possible that the flowing of the liquid medium into the gap is not completely prevented but merely reduced or made more controllable with regard to the depth or with regard to certain portions of the gap.

One particular refinement of the invention provides that the widening of the gap between the electronic semiconductor component and the carrier system is created by a channel that extends substantially parallel to the edge of the gap. Such a channel will be suitable for use in particular in the case of semiconductor component surfaces with little structuring and can be introduced for example by simple mechanical or wet-chemical processes into variously formed carrier systems, including at certain portions of the surface, so that the form of the carrier system does not have to correspond to that of the semiconductor components.

It is consequently also possible to provide the carrier system with a number of such channels that correspond in form and size to certain, standardized electronic semiconductor components, so that a carrier system can be used more flexibly.

In a favorable embodiment of the invention, on the other hand, the form and size of the carrier system corresponds substantially to the form and size of the electronic semiconductor component and the widening of the gap between the electronic semiconductor component and the carrier system is created by a phase on the edge of the carrier system that is facing the electronic semiconductor component. This embodiment has the effect of preventing a certain, not inconsiderable amount of the aggressive, liquid medium from remaining on a surface in front of the gap and of preventing special circumstances from being unwantedly conducive to the medium subsequently flowing into the gap.

If, in a way corresponding to a refinement according to the invention, the electronic semiconductor components are in the wafer array, the carrier system can be adapted particularly favorably with regard to the form and be profiled in the edge region of the gap on account of the wafer form of the electronic semiconductor components. A silicon wafer that has not been thinned can often be used as the carrier system. In this case, the phase at the edge of the carrier wafer serving as a carrier system or the channel on its surface can be introduced by the tried-and-tested, low-cost processes and a carrier system which itself is planar to a high degree is obtained.

For this reason, this embodiment is used in the case of the wafer thinning described, where the planar underlying surface is important on account of the low final thicknesses of the wafer to be worked. If the wafer thinning is performed for example by the known spin etching, the carrier system is a rotationally symmetrical, rotatably mounted plate. In this case, the liquid medium is an etching medium and is applied to a rotating wafer in the region of the axis of rotation, distributes itself evenly over the back of the wafer with the aid of the centrifugal forces and in this way leads to the desired uniform deposition of material.

The etching medium, transported to the edge of the wafer by the centrifugal forces, flows around its edge and is prevented from flowing under the wafer and from damaging undercutting of the wafer because of the widening according to the invention of the gap between the wafer to be worked and the carrier system.

These special embodiments of the invention are also used in mechanical wafer thinning. Here, however, the liquid medium is the abrasive fluid, which contains abrasive particles and material particles and is consequently likewise to be prevented from flowing between the wafer and the carrier system as a result of the capillary action of the gap and causing damage there to the wafer.

In a particularly favorable refinement of the invention, it is provided that the width of the widening of the gap is dimensioned on the basis that the depth of penetration into the gap for a defined liquid medium and for defined materials of the electronic semiconductor components and of the carrier system following the widening is at least virtually zero. As described at the beginning, the characteristic variables of these materials likewise have an influence on the depth of penetration of the liquid medium into the gap.

Not only can the gap-forming materials of the electronic semiconductor components and of the carrier system only be made hydrophobic, and consequently suppress the capillary action, in individual cases, but also the liquid medium itself is generally determined by the requirements of the process. However, with knowledge of the properties of these materials that determine the capillary action, the wetting behavior and the surface tension, and knowledge of further influencing variables, the depth of penetration of the liquid medium into the gap can be set very well by means of the width and the depth of the widening of the gap. Such further influencing factors would be, for example, the centrifugal force in the spin-etching process, which counteracts the capillary force and can be easily regulated. Consequently, the action of the liquid medium that is present can be controlled in a specific manner for defined applications.

DESCRIPTION OF THE DRAWINGS

The invention is to be explained in more detail below on the basis of an exemplary embodiment. In the associated drawing.

The following list of reference symbols can be used in conjunction with the figures:

| | |
|---|---|
| 1 | semiconductor component |
| 2 | wafer |
| 3 | active side |
| 4 | carrier system |
| 5 | balls of adhesive |
| 6 | channel |
| 7 | gap |
| 8 | vacuum chuck |
| 9 | axis of rotation |
| 10 | etching medium |
| 11 | back |
| 12 | phase |

DETAILED DESCRIPTION OF ILLUSTRATIVE EMBODIMENTS

Figure 1:
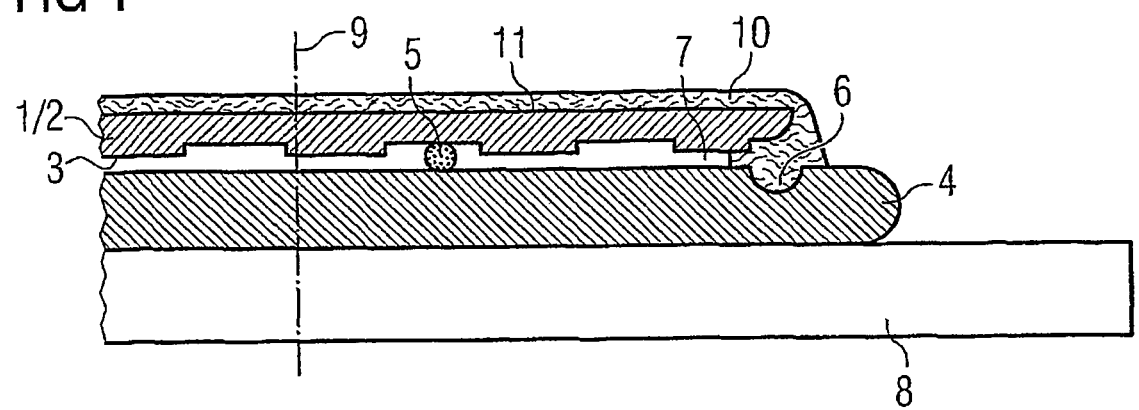
FIG. 1 shows a schematic partial sectional representation of the arrangement according to the invention on a chuck with gap widening in the form of a channel.

In the arrangement according to the invention of electronic semiconductor components 1 on a carrier system 4, as schematically represented in FIG. 1, the semiconductor components 1 in the wafer array are mounted with the active side 3, having a structure, downward (face down) on a round carrier system 4 by spot adhesion, so that balls of adhesive 5 detachably establish the connection between the semiconductor component 1, in this exemplary embodiment the wafer 2, and the carrier system 3 only at some locations.

The diameter of the carrier system 4 is greater than the diameter of the wafer 2. On the diameter that corresponds approximately to that of the wafer 2 the carrier system 4 has a channel 6 with a semicircular cross section, the depth of which in the exemplary embodiment represented corresponds approximately to the height of the gap 7 between the wafer 2 and the carrier system 4, so that the gap 7 is increased in the region of the channel 6 to twice the width.

The carrier system 4 is in turn fixed by means of a vacuum on a vacuum chuck 8. In a way similar to the carrier system 4 and the wafer 2, the vacuum chuck 8 has a circular form. All three component parts of this arrangement are arranged rotatably on an axis of rotation 9, so that the liquid etching medium 10 applied in the region of the axis of rotation 9 during the rotation is present in a virtually even distribution on the back 11 of the wafer 2 after a certain time.

The etching medium 10 coming out over the edge of the wafer 2 flows around the edge and fills the edge region of the gap 7 between the wafer 2 and the carrier system 4, including the channel 6 formed there, and only a very small amount enters the gap 7 via the channel 6.

Figure 2:
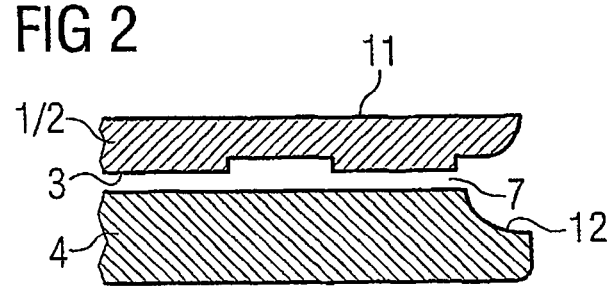
FIG. 2 shows a schematic partial sectional representation of the arrangement according to the invention with gap widening by a phase.

FIG. 2 represents another embodiment of the profiling of the carrier system 4, the carrier system 4 being of virtually the same size as the electronic semiconductor components 1. According to the invention, in such a case it is possible that the carrier system 4 has on the edge that is facing the semiconductor components 1 a phase 12, which in the embodiment represented has virtually the cross section of a quarter circle and reduces the thickness of the carrier system 4 at its outer edge to approximately half.

What is claimed is:

1. An arrangement of a semiconductor component on a carrier system for treating the semiconductor component with a liquid medium, wherein the semiconductor component is mounted with an active side of the semiconductor component facing the carrier system using adhesive balls in such a way that the arrangement comprises a gap between the semiconductor component and the carrier system; and
   an annular channel disposed on the carrier system for collecting an etching medium, wherein the annular channel is disposed below an outer peripheral edge of a substrate;
   wherein the gap is configured to be wider in an edge region to prevent seeping of the liquid medium in to the gap, and
   wherein the carrier system comprises no gas outlets for preventing the seeping of the liquid medium into the gap.

2. The arrangement as claimed in claim 1, wherein the gap in the edge region between the semiconductor component and the carrier system is wider due to a channel that extends substantially parallel to the edge region of the gap.

3. The arrangement as claimed in claim 1, wherein the carrier system has a form and size that corresponds substantially to a form and size of the semiconductor component and in that the gap in the edge region between the semiconductor component and the carrier system is wider due to a phase on the edge region of the carrier system that is facing the semiconductor component.

4. The arrangement as claimed in claim 1, wherein the liquid medium is an etching medium.

5. The arrangement as claimed in claim 1, wherein the gap at the edge region has a width that is dimensioned based on a depth of penetration into the gap for the liquid medium and for defined materials of the semiconductor component and of the carrier system.

6. The arrangement of claim 1, wherein the semiconductor component is detachably mounted to the carrier system.

7. An arrangement of a semiconductor component and a carrier system, the arrangement comprising:
   a carrier including an outer peripheral edge;
   a substrate having an outer peripheral edge, the substrate mounted on the carrier such that a gap of a small distance exists between a main surface of the carrier and a main surface of the substrate, wherein the substrate is attached to the carrier using ball shaped adhesive; and
   an annular channel disposed on the carrier for collecting an etching medium, wherein the annular channel is disposed below the outer peripheral edge of the substrate,
   wherein at the outer peripheral edge, the substrate is spaced from the carrier by a distance greater than the said small distance along the main surface of the substrate to prevent seeping of the etching medium in to the gap, and
   wherein the carrier comprises no gas outlets for preventing the seeping of the etching medium into the gap.

8. The arrangement of claim 7, wherein the carrier includes a channel disposed therein, the channel having a shape corresponding to the outer peripheral edge of the substrate such that the outer peripheral edge of the substrate is aligned with the channel.

9. The arrangement of claim 8, wherein the channel has a semicircular cross-section.

10. The arrangement of claim 7, wherein the substrate comprises a semiconductor wafer.

11. The arrangement of claim 10, wherein the main surface of the substrate comprises active circuitry.

12. The arrangement of claim 7, wherein the outer peripheral edge of the substrate is substantially aligned with the outer peripheral edge of the carrier.

13. The arrangement of claim 7, wherein the substrate is spaced from the carrier by at least twice a minimum distance along the entire outer peripheral edge of the substrate.

14. An arrangement of a semiconductor component on a carrier system, the arrangement comprising:
   a substrate comprising an outer peripheral edge;
   a carrier including an outer peripheral edge mounted on a vacuum chuck;
   a gap disposed between the substrate and the carrier, wherein a gap distance between the main surface of the carrier and a main surface of the substrate is small;
   adhesive balls for supporting the gap; and
   an annular channel disposed on the carrier for collecting an etching medium, wherein the annular channel is disposed below the outer peripheral edge of the substrate, wherein in an area above the annular channel, the substrate is spaced from the carrier by a gap distance greater than the said small gap distance along the main part of the carrier to prevent seeping of the etching medium into the gap, and wherein the carrier comprises no gas outlets for preventing the seeping of the etching medium into the gap.

15. The arrangement of claim 14, wherein the substrate and the carrier are about the same size.

16. The arrangement of claim 15, wherein the annular channel is disposed on the outer peripheral edge of the carrier.

17. The arrangement of claim 16, wherein the annular channel comprises a quarter circle, wherein the quarter circle reduces a thickness of the carrier system at an outer edge to about a thickness of the carrier system in an inner region.

18. The arrangement of claim 14, wherein the gap impedes a flow of the etching medium onto the main surface of the substrate.

19. The arrangement as claimed in claim 14, wherein the semiconductor component comprises a semiconductor wafer.

20. The arrangement as claimed in claim 19, wherein the carrier comprises a rotationally symmetrical, rotatably mounted plate.

* * * * *